US005579007A

United States Patent [19]
Paul

[11] Patent Number: 5,579,007
[45] Date of Patent: Nov. 26, 1996

[54] CHARGE-TO-DIGITAL CONVERTER

[75] Inventor: Susanne A. Paul, Lexington, Mass.

[73] Assignee: Massachusetts Institute of Technology, Cambridge, Mass.

[21] Appl. No.: 271,520

[22] Filed: Jul. 7, 1994

[51] Int. Cl.$^6$ .................................................. H03M 1/42
[52] U.S. Cl. ................................. 341/172; 341/162
[58] Field of Search ............................ 341/127, 161, 341/162, 172

[56] References Cited

U.S. PATENT DOCUMENTS

| | | | |
|---|---|---|---|
| 3,806,772 | 4/1974 | Early | 330/35 |
| 4,107,550 | 8/1978 | Jacquart et al. | 341/150 |
| 4,171,521 | 10/1979 | Wang et al. | 341/172 |
| 4,206,446 | 6/1980 | Rockett, Jr. | 341/172 |
| 4,326,192 | 4/1982 | Merrill et al. | 341/164 |
| 4,329,679 | 5/1982 | Jensen | 341/172 |
| 4,375,059 | 2/1983 | Schlig | 341/172 |
| 4,471,341 | 9/1984 | Sauer | 341/172 |
| 4,489,309 | 12/1984 | Schlig | 341/172 |
| 4,625,293 | 11/1986 | Vogelsong et al. | 364/606 |
| 5,014,059 | 5/1991 | Seckora | 341/172 |
| 5,030,953 | 7/1991 | Chiang | 341/172 |
| 5,061,927 | 10/1991 | Linnenbrink et al. | 341/138 |
| 5,189,423 | 2/1993 | Linnenbrink et al. | 341/172 |
| 5,327,138 | 7/1994 | Linnenbrink et al. | 341/172 |

FOREIGN PATENT DOCUMENTS 0068143  1/1983  European Pat. Off. .

*Primary Examiner*—Marc S. Hoff
*Attorney, Agent, or Firm*—Samuels, Gauthier, Stevens & Reppert

[57] ABSTRACT

A charge-to-digital converter including a pipeline of at least one conversion unit, each conversion unit operable for processing a serial stream of positive and negative signal charges corresponding to a differential signal to be digitized and scaling charges corresponding to a full-scale signal, and for generating a digital output signal. Each of the conversion units includes the following; A receiver which receives positive and negative signal charges and a scaling signal from a predetermined source. Certain embodiments include positive and negative signal channels having a distributed sensing pipeline operable for respectively producing positive and negative accumulator charges representative of the positive and negative signal charges. A unit for generating a modification charge corresponding to a predetermined proportion of the full-scale signal. A comparator for comparing the positive and negative accumulator charges and generating the digital output signal in accordance with the comparator result. A unit responsive to the comparator for adding the modification charge to the lesser of the positive and negative signal charge.

27 Claims, 11 Drawing Sheets

$$(1) \quad sm_m = sm_0 + gc_0 \times \sum_{i=1}^{m} d_i 2^{-i}$$

$$(2) \quad gc_m = gc_0 \times 2^{-m} = gc_0 \times \sum_{i=m+1}^{\infty} 2^{-i}$$

$$(3) \quad sp_m = sp_0 + gc_0 \times \sum_{i=1}^{m} \overline{d_i} 2^{-i}$$

$$(4) \quad d_i = 1 \text{ if } s_i > r_i$$

$$(5) \quad sp_0 - sm_0 \approx gc_0 \times \left[ \sum_{i=1}^{N} d_i 2^{-i} - \sum_{i=1}^{N} \overline{d_i} 2^{-i} \right]$$

$$(6) \quad \sum_{i=1}^{N} d_i 2^{-i} + \sum_{i=1}^{N} \overline{d_i} 2^{-i} = 1 - 2^{-N}$$

$$(7) \quad sp_0 - sm_0 \approx gc_0 \times \left[ \sum_{i=1}^{N} d_i 2^{(1-i)} - 1 \right]$$

*FIG. 1B*

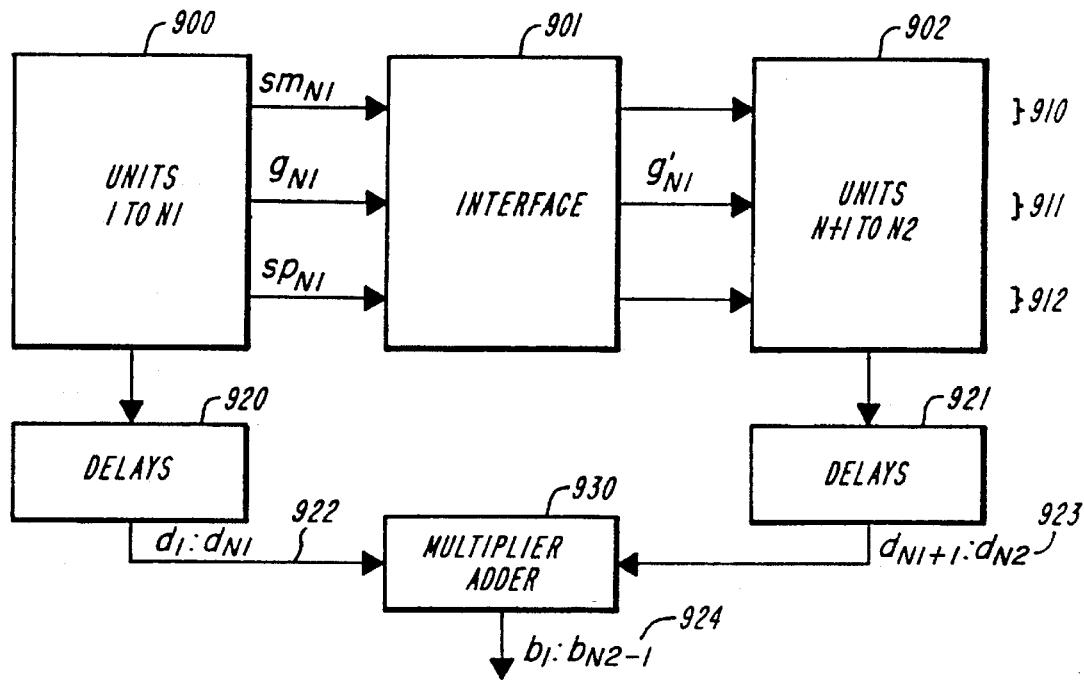
*FIG. 5A*
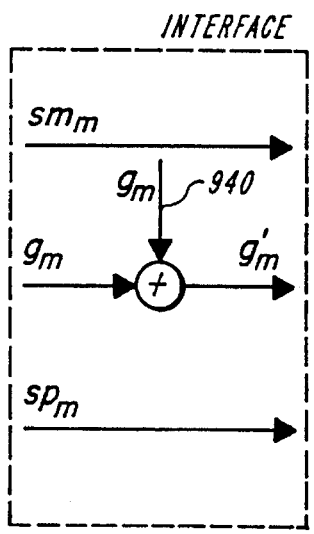
*FIG. 5B*
$$\begin{array}{c} d_1 \quad d_2 \ldots d_{N1} \\ +\phantom{d_1 \quad d_2 \ldots} d_{N1+1} \ldots d_{N2} \\ \hline b_1 \quad b_2 \ldots b_{N1} \ldots b_{N2-1} \end{array}$$
*FIG. 5C*

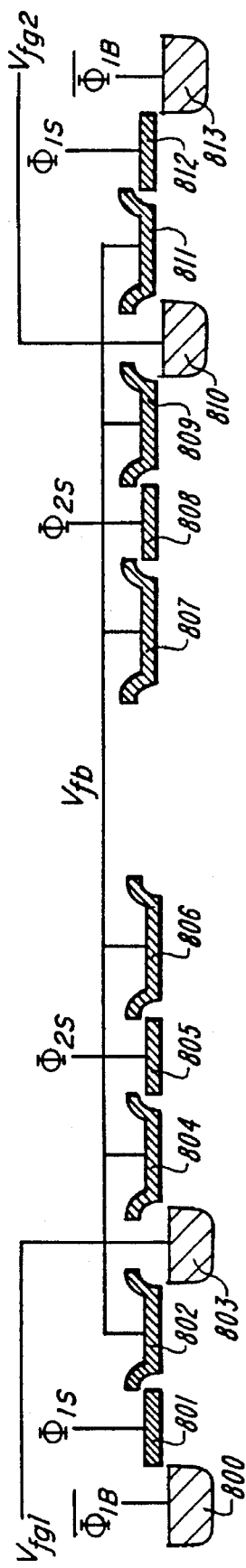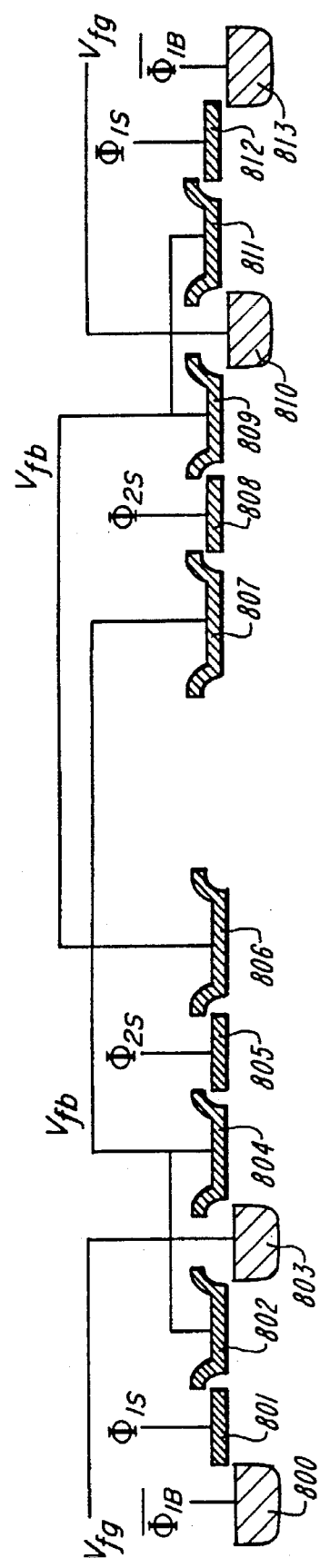

CHARGE-TO-DIGITAL CONVERTER

This invention was made with government support under Contract Number F19628-90-C-0002 awarded by the Air Force. The government has certain rights in the invention.

BACKGROUND OF THE INVENTION

The invention relates generally to a pipelined charge-to-digital converter (CDC), and more particularly to a charge coupled device (CCD) charge-to-digital converter used to compute the digital representation of an input charge quantity.

Charge coupled devices are well known monolithic semiconductor devices and are widely used in applications such as visible and infrared imaging, analog delay lines, analog filters, and high speed analog memories. In most applications, a digital representation of the analog charge signal is ultimately desired. Digitizing charge quanta is traditionally performed by an indirect procedure. First, the charge quantity is converted to an analog voltage which is buffered and driven off-chip. External correlated-double-sampling circuitry is then used to reduce the effect of nonidealities introduced by the charge-to-voltage conversion. Finally, the signal is sampled by a sample-and-hold and the result is digitized by a conventional A/D converter. This entire process must be extremely low-noise, requires significant hardware and power, is not readily extendible to higher speeds, and can not easily be integrated onto a focal plane.

There are two fundamental drawbacks with the traditional approach. First, the input signal which is in the form of a charge quantity is converted to a voltage. Second, the discrete-time input signal is converted to continuous-time signal, which then must be resampled. Both of these operations are eliminated by computing the digital representation of the charge signal on chip in the charge domain. In this way, the charge-to-voltage translation, correlated-double-sampling, analog amplifiers, sample-and-hold, and external A/D converter are all eliminated and the entire path is replaced by a single charge-to-digital converter.

Conventional charge-to-digital converters are disclosed in the following U.S. patents, the disclosures of which are incorporated herein by reference: U.S. Pat. Nos. 4,489,309 (Schlig), 4,375,059 (Schlig), 4,171,521 (Wang et al.), 5,189,423 (Linnenbrink et al.), 5,061,927 (Linnenbrink et al.), 4,471,341 (Sauer), 4,329,679 (Jensen), 3,806,772 (Early), 5,014,059 (Seckora), 4,326,192 (Merrill et al.), and 4,107,550 (Jacquart et al.). Many of the prior art systems are subject to severe accuracy limitations. These systems either require operations, such as subtraction, which can not easily or accurately be performed using CCDs, or they contain a single-ended signal flow. Schlig '309 discloses a significantly improved charge-to-digital converter. It has a fully differential architecture, requires only the operations of addition and division by two, and can be easily and accurately implemented using CCD technology.

The resolution (the size of a quantization step) of the converter described in Schlig '309 is unfortunately restricted by the maximum achievable sensitivity of charge-to-voltage conversion using conventional floating-gate means and by the minimum achievable voltage resolution of a comparator. A floating-gate means of charge sensing always results in a gain of less than unity. In other words, the gate's resulting voltage swing is less than the channel potential modulation caused by an input charge. The maximum allowable output voltage using this technique is determined by the technology and the clocking method used and is typically limited to a small fraction of the full power supply range. In this case, an increase in the charge resolution corresponds to a smaller LSB voltage swing and necessarily requires a corresponding increase in the resolution of the comparators.

The dynamic range (the number of quantization levels) of the Schlig '309 converter is also constrained by the maximum allowable input common-mode range of the comparators and by mismatches between different sensing paths. The device accomplishes subtraction by performing addition to a complimentary signal and, therefore, accumulates a large common-mode signal along the pipeline. Within each stage, two charge quantities are independently converted to voltages and then differentially compared. Mismatches between different sensing paths, amplified by the common-mode signal, must remain less than the differential signal corresponding to an LSB. A more sensitive method of charge-to-voltage translation than a conventional floating-gate technique is desirable for resolving small differential signals. However, this can not be achieved using the prior art converter because translation of the common-mode signal must remain within the allowable input range of the comparators.

It is therefore an object of the present invention to provide a charge-to-digital converter with improved charge resolution by amplifying signals in the charge-domain prior to charge-to-voltage conversion and comparison.

It is a further object of the present invention to provide a charge-to-digital converter with increased dynamic range, and reduced sensitivity to systematic mismatches by suppressing common-mode signals in the charge-domain before charge-to-voltage conversion.

It is a still further object of the present invention to provide a charge-to-digital converter with reduced susceptibility to dynamic sensing noise and to sensing mismatches by sensing signals multiple times over multiple stages.

It is another object of the present invention to provide a charge-to-digital converter with reduced power consumption and reduced comparator requirements by performing all critical processing on signals in the charge-domain.

It is yet another object of the present invention to provide a charge-to-digital converter with reduced susceptibility to comparator errors by incorporating digital error correction techniques.

SUMMARY OF THE INVENTION

Accordingly, the present invention is a charge-to-digital converter including a pipeline of at least one conversion unit, each conversion unit operable for processing a serial stream of positive and negative signal charge packets corresponding to a differential signal to be digitized and for generating a digital result representative of this signal. Each of the conversion units comprises means for receiving positive and negative signal charge packets and one or two scaling signals from a predetermined source; means for generating a modification charge packet corresponding to predetermined proportions of the scaling signals; a comparator for comparing positive and negative accumulator charge packets and generating a digital output signal in accordance with the results of the comparison; means responsive to the comparator for adding the modification charge packet to the lesser of the positive and negative signal charge packets; and means for providing the processed first and second signal charge packets to a subsequent conversion unit. According to certain embodiments, the positive and negative signal channels have a distributed sensing pipeline of k stages, the sensing stages operable for respectively producing positive and negative accumulator charge packets corresponding to k accumulated positive and negative signal charge packets.

A charge-to-digital converter may be used with either voltage or charge inputs, however, the greatest advantages occur when it is used in a direct charge-to-digital conversion mode. Two of the most significant benefits of the device are that it completely eliminates the need for intermediate charge-to-voltage translation and it preserves the sampled nature of the CCD data. These are unique capabilities which can not be achieved in conventional analog-to-digital conversion using CMOS or bipolar technologies.

The most promising application for a CDC is in visible and infrared imaging where input signals are charge quantities. It will allow dramatically reduced power, weight, and system complexity over conventional readout methods. However, for most of these applications, the input charge packets are limited in size and this places stringent requirements on charge sensing and comparator resolution. The comparators must be capable of resolving a charge differential equal to an LSB, which generally corresponds to a few hundred electrons. This becomes even more difficult at higher frequencies such as video data rates. Even with optimized, high performance comparators, the comparison will be a significant limitation of the basic architecture.

BRIEF DESCRIPTION OF THE DRAWINGS

FIG. 1B shows the conversion algorithm which is implemented by the CDC of the present invention;

FIG. 5A shows a block diagram representation of an exemplary embodiment of the present invention which incorporates digital error correction; FIG. 5B shows an exemplary interface stage; FIG. 5C shows an error correction algorithm.

FIG. 8A shows an exemplary structure for achieving common-mode feedback; and FIG. 8B shows an exemplary structure for achieving differential mode amplification.

DETAILED DESCRIPTION OF THE ILLUSTRATED EMBODIMENTS

Figure 1A:
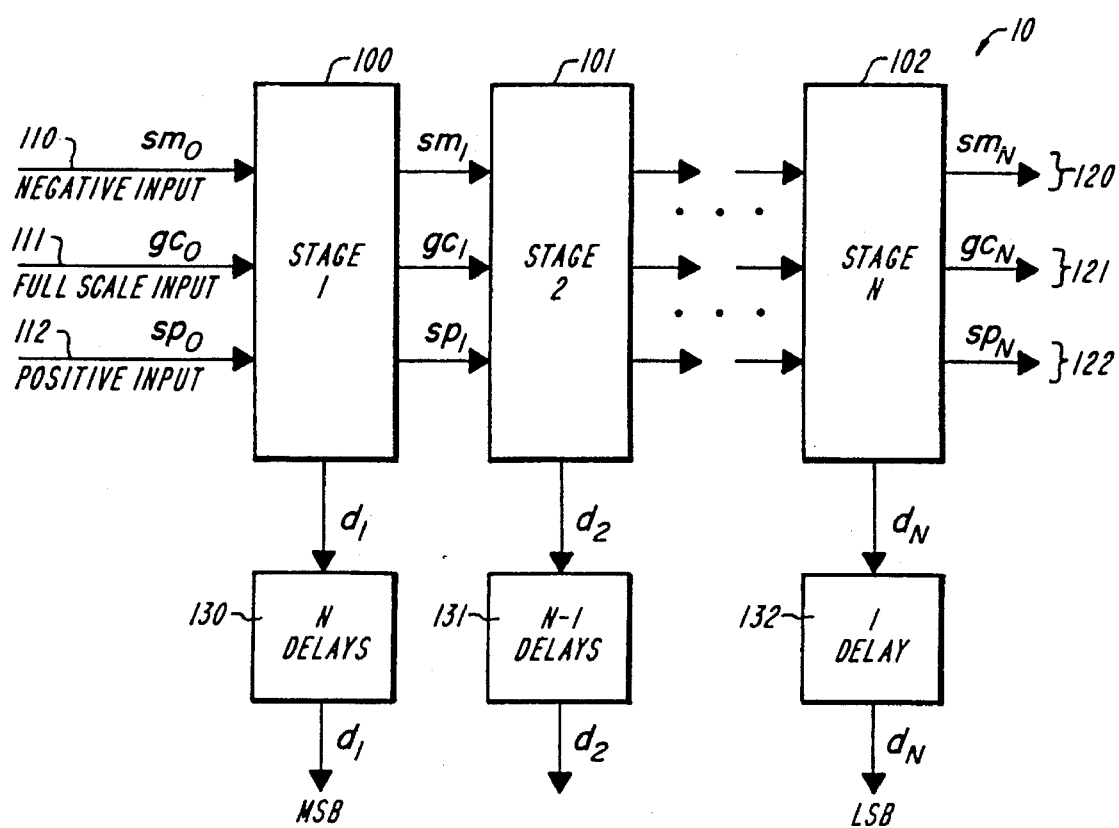
FIG. 1A shows a block diagram of a charge-to-digital converter in accordance with the present invention.

FIG. 1A shows a block diagram of a charge-to-digital converter 10 (CDC) in accordance with the present invention. The N-bit CDC contains a pipeline of N identical conversion units 100–102 through which a conversion result is determined successively, from the most significant bit (MSB) to the least significant bit (LSB) in a bit-serial manner. The pipeline consists of three charge flow channels, 120,122,121, referred to as the negative, positive, and scaling channels, respectively, with corresponding charge packets denoted $sm_m$, $sp_m$, and $gc_m$. The channels begin at the converter inputs, 110,112,111, pass through all conversion units in the pipeline, and terminate after the final unit at charge drains. Each conversion unit receives signals from the immediately preceding unit, operates on these signals, and passes them on to the following unit. Multiple inputs are processed in parallel along the pipeline so that one digital word is completed at each clock cycle. Optionally, the bits corresponding to a single input may be appropriately delayed by delay units 130–132 so that they arrive simultaneously at the converter's output.

The conversion algorithm which is implemented by the CDC of the present invention is shown in FIG. 1B. The algorithm is based on bit-serial successive-approximation A/D techniques which are well known in the technical field. A fully differential algorithm has been chosen because it can be implemented using only the operations of addition and fixed ratio division, and these operations can be easily and accurately performed using CCD technology. Equations 1–3 describe the signal flow through the negative, scaling, and positive channels, respectively, with the subscript m denoting quantities in the $m^{th}$ unit. Prior to the first conversion unit 100, the converter 10 accepts a differential input on signals $sm_0$ (110) and $sp_0$ (112) and a full-scale reference signal, $gc_0$ (111). As indicated by equation 2, the signal $gc_m$ is divided by a factor of two at each unit, and therefore decreases exponentially along the pipeline. The scaling signal in any given unit is approximately equal to the sum of the scaling signals in all the units following it. The quantities $sp_m$ and $sm_m$ are compared and a single digital bit, $d_m$ (comprising bits $d_1$, $d_2$, ... $d_N$), representing the sign of their difference is generated. Each conversion unit utilizes the signal $d_m$ to increase either $sp_m$ or $sm_m$, whichever is smaller, by the quantity of charge in its scaling channel output, $gc_m$.

Equations 1 and 3 describe this process using bits $d_m$ ($d_1$, $d_2$, ... $d_N$) delayed to produce a parallel word format. Provided the input differential $sp_0-sm_0$ is restricted to have a magnitude less than the full scale value $gc_0$, the difference between $sp_m$ and $sm_m$ in each unit is guaranteed to be less than the quantity $gc_m$. After a sufficient number of conversion units, the quantity $gc_m$ can be assumed to be negligible and the signals $sp_m$ and $sm_m$ may be approximated as being equal. The quantity $gc_N$, the scaling output from the last unit, will be equal to $gc_0*2^{-N}$ and is referred to as an LSB. The relation $sp_0-sm_0$ shown in equation 5 can be found by subtracting equations 1 from 3 and approximating $sp_N-sm_N$ by 0. The error introduced by this approximation will be less than an LSB. Finally, the most convenient equation for recovering the input signal, equation 7, is arrived at by substituting the result of equation 6 into equation 5 and ignoring the offset term $2^{-N}$. In this format, the digital result is composed directly from each comparator's output bit. The result is an N bit offset-binary word which approximates the number of LSB quantities spanned by the differential input. For example in a 4-bit converter, an input of $-1*gc_0$ corresponds to a digital result of 0000, an input of zero to 1000, and an input of $gc_0*(1-2^{-4})$ to 1111.

The algorithm computed by the converter of the present invention performs subranging on the signal at each stage.

For example, the first stage determines whether the signal lies in the upper or lower half of the dynamic range, followed by the second stage which decides whether the signal lies in the upper or lower half of the region determined by the first stage. This same procedure occurs for each successive stage, until the signal has been located to within a subrange whose size equals a converter LSB. The operation of subranging can be described physically in terms of charge quantities. At any given stage, the scaling charge quantity, gm, corresponds to the size of its subrange and the maximum difference between the negative and positive signals is bounded by this quantity. Addition of $2^{-1}*g_m$ to the smaller of $sm_m$ and $sp_m$ shifts the differential signal by the size of the current subrange and the resulting differential signal corresponds to a residue. Correct operation requires the differential signals after the final stage to be equal to within an LSB, and this in turn requires that the modification charge in the last stage is sufficient to cancel any remaining differential. On a subrange boundary, where the differential signals are equal and the comparator's decision is arbitrary, the $2^{-1}*g_m$ quantity added to one channel is equal to the $2^{-1}*g_m$ quantity which will be added to the other channel in all later stages. In this way, their difference will be restored to zero.

Input $gc_0$ determines the converter's gain and quantization step size. A fixed-gain converter will typically have a time-invariant scaling input. Alternatively, $gc_0$ may be viewed as a third signal by which the result is divided, and it can be varied with time to achieve adaptive dynamic range adjustment, variable gain, or signal division. Inputs $sp_0$ and $sm_0$ can arrive as a differential signal pair, or one of them may be held at a constant level for single-ended operation. A single-ended configuration can also utilize the second signal input to accomplish offset subtraction.

Figure 2:
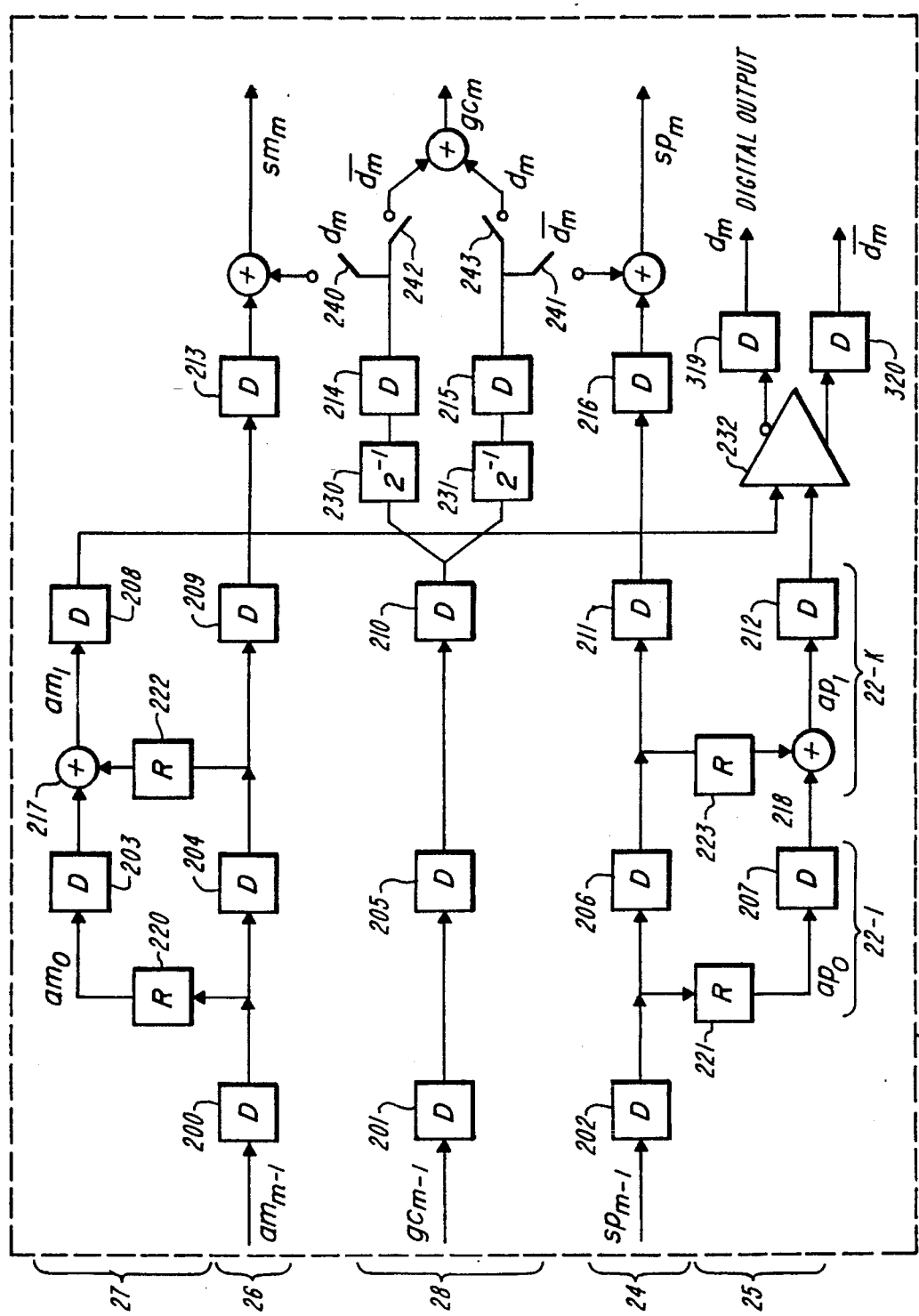
FIG. 2 shows a block diagram of a single conversion unit of a charge-to-digital converter utilizing distributed sensing in accordance with the present invention.

Various embodiments of the architecture of FIG. 1A and the algorithm of FIG. 1B differ in the details of the individual conversion units. Three exemplary embodiments are illustrated in FIGS. 2–4, and will be described hereafter in detail. Each of these figures is intended to illustrate overall structure and signal flow at a technology independent level. They do not specifically indicate the presence of individual CCD elements.

The units labelled D indicate single delay elements and physically correspond to the existence of a transfer gate which serves to block the flow of charge when in one state and to allow charge to flow forward when in the other state. The actual storage of charge occurs in a CCD storage well between two such transfer gates. The additive elements algorithmically indicate charge summation and physically correspond to a single CCD storage well which accepts input charge from two sources. The pairs of units labelled $2^{-1}$ indicate fixed ratio charge division and physically correspond to charge splitting gates such as a single CCD storage well designed to pass charge on to two equally sized receiving wells.

Operation of the device does not depend on the particular CCD clocking methodology used, and any one of the conventional two-phase, four-phase, or one-and-half phase techniques can be employed. The CCD gate configurations and timing corresponding to each of these are well known in the art of CCD design and will not be described in detail. For purposes of illustration, the following embodiments are assumed to use four-phase CCD structures. Therefore, the signal path between any two delay elements consists of four CCD electrodes and requires an entire clock cycle to traverse. The signal path is divided into various phases of operation, each of which corresponds to activity occurring over an entire clock cycle in one pipeline stage. The following descriptions trace the passage of a single input through the various phases of each conversion unit. It will be appreciated that because the device operates in a pipelined manner, other signals will follow immediately behind.

With reference now to FIG. 2, a block diagram of a single conversion unit 20 of a charge-to-digital converter utilizing distributed sensing in accordance with the present invention is shown. For illustrative purposes a 2-stage distributed sensing pipeline labeled as 22-1 through 22-K is shown. Charges in the positive 24 and negative 26 signal channels are repeatedly, non-destructively sensed and replicated in the successive stages. The replicated charges are accumulated in a positive accumulator channel 25 associated with the positive signal channel and a negative accumulator channel 27 associated with the negative signal channel. The accumulated results are passed forward in parallel with the signals being sensed so that after K stages they will contain charge packets representing K*sm and K*sp with a differential which has been amplified. The charge in the positive and negative accumulator channels is then sensed by either destructive or nondestructive techniques to form the input to the comparator, 232. The charge in the scaling channel 28 is split in half to form positive and negative modification packets 231 and 230. The outputs of the comparator, $d_m$ and $d_m$, are used to direct one of these modification packets to its corresponding signal channel and the other to the scaling channel output. One of the comparator outputs is used to form the digital result.

The conversion unit 20 is suited to applications with a small LSB and medium dynamic range requirements. In such cases, minimum geometry CCD gates are used and the gain of a floating gate amplifier is dominated by parasitics. The size of the LSB charge quantity is sufficiently small that the voltage it would generate when sensed by floating gate devices is less than the resolution of the comparators or the input-offset error of a voltage amplifier. The charge signals must be amplified before they are converted to a voltage, and because the sensing process must occur non-destructively, this requires replicating charge packets. For these applications, the full-scale charge quantity is sufficiently small that amplification of the common-mode signal is acceptable and the positive and negative channels may be processed independently.

During the first phase of operation of unit 20, the charges $sm_{m-1}$, $sp_{m-1}$, and $gc_{m-1}$ corresponding to the outputs from the previous unit, are clocked into charge storage elements 200, 202, 201, respectively. Charge replicators 220 and 221 nondestructively sense the differential signal charges and produce output charges, $am_0$ and $ap_0$, representative of each. In the second phase of operation, charges are advanced to delay elements 204, 206, and 205 respectively. Charge replicator outputs $am_0$ and $ap_0$ are advanced to delay elements 203 and 207 which form the beginning of the positive and negative accumulator channels. Charge replicators 222 and 223 nondestructively sense the differential signal charges and produce output charges, $am_1$ and $ap_1$, which are added to the existing contents of the positive and negative accumulators 217 and 218.

During the third phase of operation, differential signal charges are advanced to delay elements 209 and 211. Charge $gc_m$ is advanced to delay element 210 and is split into two equal modification charge packets by charge splitting gates 230 and 231. Charge stored in the positive and negative accumulators is passed forward to delay elements 208 and 212, where it is destructively sensed by the input of a comparator 232. The comparator decides which accumulator had more charge, and produces two complementary digital signals, $d_m$ and $/d_m$, indicative of the result.

In the fourth phase of operation, signal charges are advanced to delay elements 213 and 216. The comparator 232 outputs, $d_m$ and $d_m$, are latched by delay elements 319 and 320, and are driven to conditional transfer gates 240–243. If more charge was present in the negative accumulator 208 than in positive accumulator 212,/$d_m$ will be asserted and the conditional transfer gates 241 and 242 will be activated. This will cause the modification charge from delay element 215 to be added to the positive signal charge from delay element 216, and will allow the modification charge from delay element 214 to be passed forward to become the unit's scaling output, $gc_m$. If, instead, $d_m$ is asserted, the conditional transfer gates 240 and 243 will be activated. This operation will cause the modification charge from delay element 214 to be added to the negative signal charge from delay element 213 and will allow the modification charge from delay element 215 to be passed forward to become the scaling output. The outputs of the charge summers, $sm_m$ and $sp_m$, are passed forward to become the negative and positive signal outputs from the conversion unit. The digital bit $d_m$, which was latched by delay element 319, is driven to external circuitry where it is used to form the resulting output word.

In the exemplary embodiment shown in FIG. 2, the signal is nondestructively replicated twice in two consecutive stages. This process, referred to as distributed sensing, produces amplified versions of the positive and negative signal packets for input to a comparator. It improves the charge-referred comparator resolution and reduces random sensing noise or mismatches by averaging such errors over multiple stages. Any number of additional distributed sensing stages could be included to provide further amplification, provided that the amplified common-mode signal remains within the input range of the comparator. A detailed description of a preferred method of charge replication is provided in a later section. The input-output transfer characteristic of the charge replication process is not critical because these signals are only used as inputs to the comparator and are then discarded. Therefore, the process of sensing or replicating does not need to be linear. As long as it is monotonic, the sign of the accumulated difference will be preserved and the comparator will generate the correct result.

Delay elements 208–212 as shown in FIG. 2 are not essential to the operation of the embodiment and may be removed, however, this will adversely affect the speed of the device. As shown in FIG. 2., an entire phase is allocated to each charge replication and to the comparison. If these blocks are removed, charges must be replicated, added, sensed and compared in a single phase.

Figure 3A:
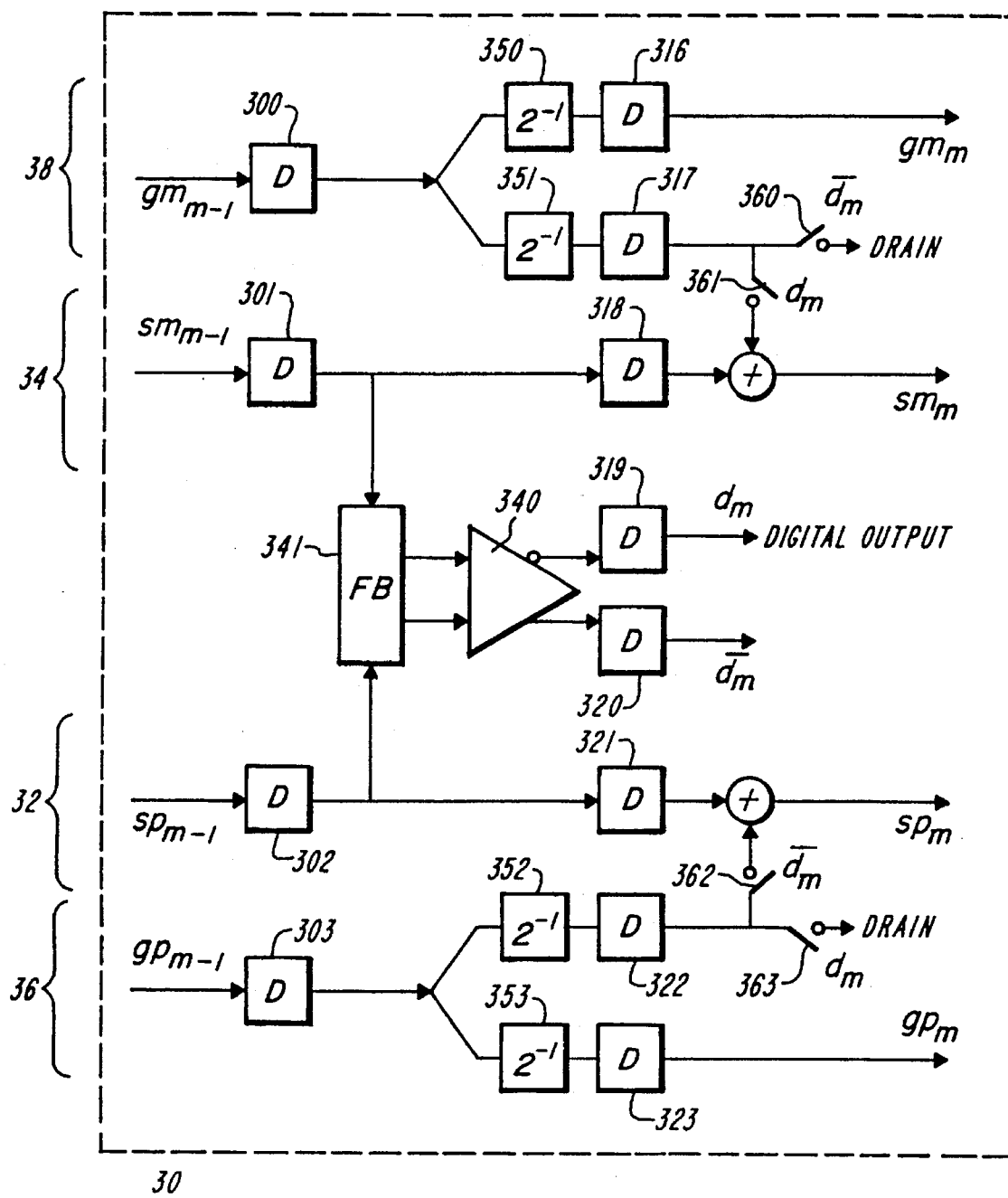
FIG. 3A shows a block diagram representation of a single conversion unit for a second exemplary embodiment of the present invention utilizing dual scaling channels.
Figure 4:
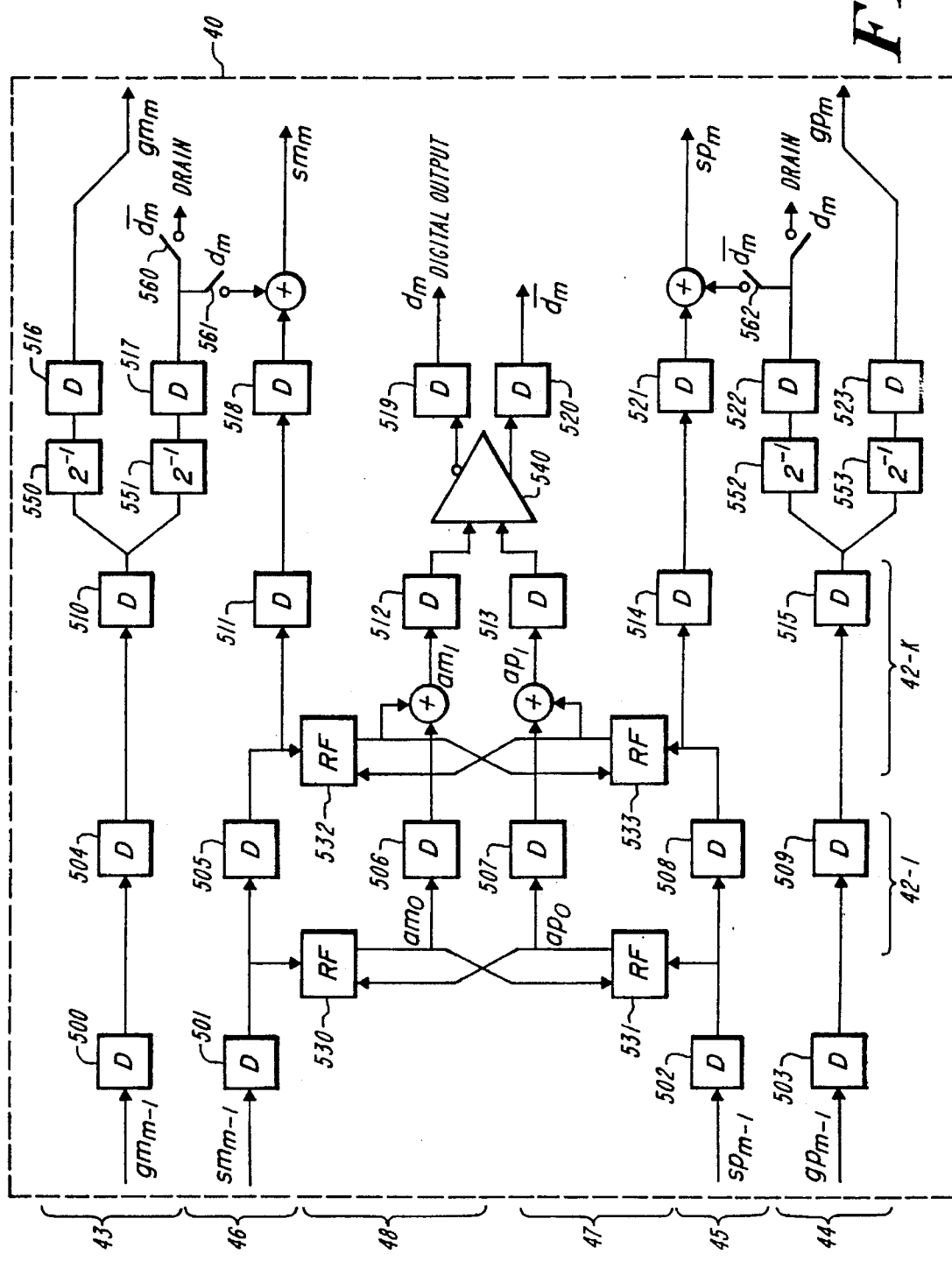
FIG. 4 shows a block diagram representation of a single conversion unit for a third exemplary embodiment of the present invention utilizing distributed sensing, dual scaling channels, and charge-domain amplification in accordance with the present invention.

With reference now to FIG. 3A, a block diagram representation of a single conversion unit 30 for a second exemplary embodiment utilizing dual scaling channels in accordance with the present invention is shown. Positive 36 and negative 38 scaling channels are used to generate modification charges for associated positive and negative signal charges, respectively. Scaling charge inputs, $gp_{m-1}$ and $gm_{m-1}$, enter from a preceding unit and are each split in half to form positive and negative modification charges 352 and 351, respectively, and scaling outputs 353 and 350, respectively. Charges in the signal channels are non-destructively sensed by structure 341 which incorporates feedback to suppress their common-mode component and generate a differential input to the comparator 340. Outputs of the comparator, dm and/dm, are then used to direct one of the positive and negative modification charges to its corresponding signal channel and to remove the other to a drain. Either of the comparator outputs may be used to form the digital result.

The conversion unit 30 is intended for applications with a medium size LSB and large dynamic range requirements. In these cases, large geometry CCD gates are used and because the charge-to-voltage gain of floating gate amplifiers is inversely proportional to their capacitance, the sensitivity will be low. Thus, the voltage generated from an LSB when sensed by floating gate devices is less than the resolution of the comparators or the input-offset error of a voltage amplifier. The charge signals must be sensed on a capacitance which is significantly smaller than that of the gates in the differential signal channel. They may not be independently sensed because each channel's common-mode component will saturate this smaller capacitance. If the two sensing paths are coupled with negative feedback, the common-mode signal may be suppressed.

If a single scaling channel, such as that for the embodiment illustrated in FIG. 2, is located between the positive and negative channels, then any signals required to couple the sensing elements from these channels will have a relatively large capacitance and must be buffered. This also prohibits the cross-coupling of any floating nodes. The architecture illustrated in FIG. 3 eliminates this restriction by including duplicate scaling channels and placing each of these outside the positive and negative channels. Accordingly, the sensing and comparison structures may be located adjacent to one another in the center of the structure.

During the first phase of operation, the charges $gm_{m-1}$, and $gp_{m-1}$ corresponding to the scaling outputs from the previous unit, are advanced to delay elements 300 and 303, and are each split into two equal modification packets by charge splitting gates 350–353. The charges $sm_{m-1}$ and $sp_{m-1}$ from the previous conversion unit are advanced to delay elements 301 and 302. Charge-mode sensing element 341 replicates the positive and negative signal charges while at the same time blocking most of the common mode charge. The outputs therefrom are fed to a comparator 340 which decides whether the positive or negative channel had more charge, and thereafter produces two digital signals, $d_m$ and $/d_m$, indicative of the result.

In the second phase of operation, the outputs of comparator 340 are latched by delay elements 319 and 320, and are driven to conditional transfer gates 360–363. If more charge was present in the negative channel, $/d_m$ will be asserted and the conditional transfer gates 360 and 362 will be activated. This operation will cause the modification charge from delay element 322 to be added to the positive signal charge from delay element 321 and the modification charge from delay element 317 to be removed by the charge drain. If, instead, $d_m$ is asserted, the conditional transfer gates 361 and 363 will be activated. This will cause the modification charge from delay element 317 to be added to the negative signal charge from delay element 318 and the modification charge from delay element 322 to be removed by the charge drain. The newly summed quantities in the negative and positive channels are passed forward to become the outputs from the current unit. Modification charges from charge splitting gates 350 and 353 are passed forward to delay elements 316 and 323, and become the scaling channel outputs from the current conversion unit. The digital bit $d_m$, which was latched by delay element 319, is driven to external circuitry where it is used to form the resulting output word.

The charge-mode sensing of element 341 is accomplished by sensing each of the charges and by feeding back and subtracting from these signals a quantity proportional to their average. One preferred method of performing this is through charge replication with common-mode feedback which is described hereinafter.

Figure 3B:
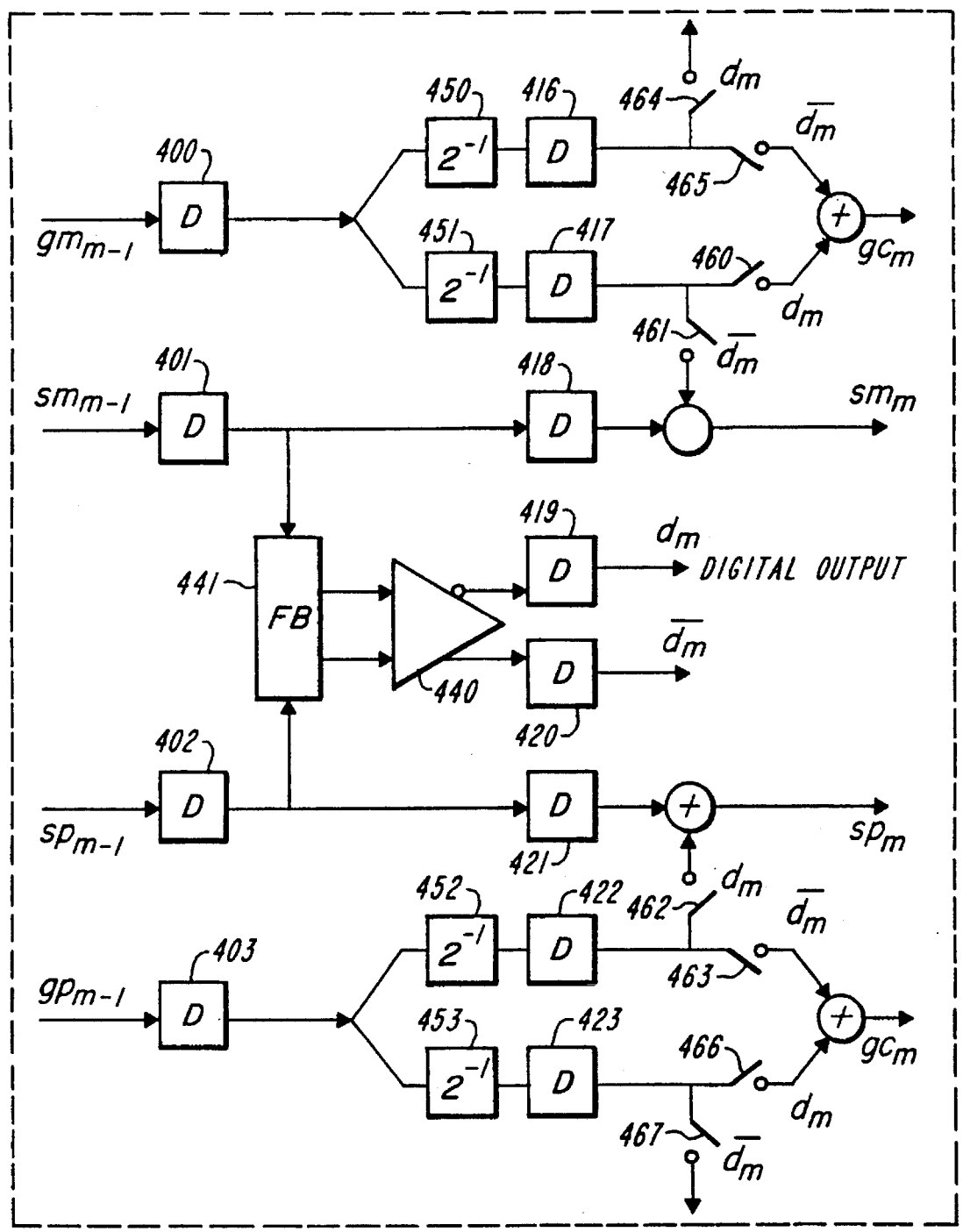
FIG. 3B shows an implementation of the second embodiment which includes an alternative means for generating and transferring modification charge packets.

An alternative implementation of the second embodiment, shown in FIG. 3B, differs from that of FIG. 3A in the means for generating and transferring modification charge packets. Positive and negative scaling signals are admitted from a preceding unit and are each split in half to generate associated positive and negative modification charges 452,453 and 451,450 respectively. One state of the comparator output, with $d_m$ asserted, will divert modification charge 452 to the positive signal channel, 453 to the positive scaling channel output, 451 to the negative scaling output, and 450 to a charge drain. The other state of the comparator, with /dm asserted will divert modification charge 452 to the positive scaling channel output, 453 to a charge drain, 451 to the negative signal channel, and 450 to the negative scaling channel output.

With reference now to FIG. 4, a block diagram representation of a single conversion unit 40 for a third exemplary embodiment of the present invention is shown. For purposes of illustration this device includes a 2-stage distributed sensing pipeline labeled as 42-1 through 42-K and dual scaling channels labeled as 43 and 44, all in accordance with the present invention. Charges in the positive 45 and negative 46 signal channels are repeatedly, non-destructively sensed in successive stages by replicators 531, 533 and 530, 532 respectively. Each of these stages incorporates feedback between the positive and negative signals for providing differential amplification and common-mode rejection of the positive and negative signal charges. The replicator outputs are accumulated in a positive accumulator channel 47 associated with the positive signal channel and a negative accumulator channel 48 associated with the negative signal channel. The accumulator charges are passed forward in parallel with the signals being sensed so that after multiple stages they will form an amplified, non-linear representation of the differential signal charges. Charges in the positive and negative scaling channels are accepted from a preceding unit and are split in half to form associated positive and negative modification charges 522 and 517, respectively and scaling outputs 523 and 516, respectively. Outputs of the comparator, dm and/dm, are used to direct one of the positive and negative modification charges to its corresponding signal channel and to dump the other. Either of the comparator outputs may be used to form the digital result.

The unit 40 is intended for applications with a small LSB and large dynamic range requirements. Such cases combine the difficulties of both previously described embodiments. The charge signals must be non-destructively replicated and amplified before they are converted to a voltage. However, the replication path must include feedback to suppress the common-mode.

During the first phase of operation, signals $sm_{m-1}$ and $sp_{m-1}$ are advanced to delay elements 501 and 502, and then fed to charge replicator with feedback units 530 and 531. The output of the negative replicator 530 is fed back to the positive replicator 531 and vice versa to provide the outputs $am_0$ and $ap_0$ with both differential amplification and common-mode suppression. Signals $gm_{m-1}$ and $gp_{m-1}$ are advanced to delay elements 500 and 503.

In the second phase of operation, signals $am_0$ and $ap_0$ are advanced to delay elements 506 and 507, and then fed to charge replicator with feedback units 532 and 533. The output from the negative replicator 533 is fed back to the positive replicator 532 and vice versa to provide differential amplification and common-mode suppression. The outputs of replicators 532 and 533 are then summed with the charges from delay elements 506 and 507 to produce signals $am_1$ and $ap_1$. Charges in the negative and positive scaling channels are advanced to delay elements 504 and 509.

During the third phase of operation, charges in the negative and positive scaling channels are advanced to delay elements 510 and 515, and are each divided into two equal packets by charge splitting gates 550–553. Charges in the positive and negative signal channels are advanced to delay elements 511 and 514, respectively. Charges in the negative and positive accumulator channels are advanced to delay elements 512 and 513, and are destructively sensed and fed to the inputs of a comparator 540. The comparator determines which of the accumulators had more charge and generates two complimentary bits corresponding to the result.

In the fourth phase of operation, the comparator outputs, $d_m$ and /$d_m$, are latched in delay elements 519 and 520 and are driven to the conditional transfer gates 560–563. If more charge was present in the negative channel, /$d_m$ will be asserted and the conditional transfer gates 560 and 562 will be activated. This operation will cause the modification charge from delay element 522 to be added to the positive signal charge from delay element 521, and the modification charge from delay element 517 to be removed by the charge drain. If, instead, $d_m$ is asserted, the conditional transfer gates 561 and 563 will be activated. This will cause the modification charge from delay element 517 to be added to the negative signal charge from delay element 518 and the modification charge from delay element 522 to be removed by the charge drain. Charges in delay elements 516 and 523 are passed forward to become the scaling channel outputs from the current conversion unit. The digital bit $d_m$ is driven to external circuity where it is used to form the resulting output word.

FIG. 5A shows a block diagram representation of an exemplary embodiment of the present invention which incorporates digital error correction. In a converter without error correction, the subranging decisions at each stage are made by the comparators, and once a subrange has been chosen, it is not possible to reverse the decision. In a typical device, the errors associated with incorrect comparisons result in non-contiguous subranges and effect conversion of those signals which lie close to subrange boundaries. Physically, an incorrect comparator decision will cause the modification charge to be added to the larger channel rather than the smaller. The unit's differential output will be greater than its scaling output and the differential can not be restored to zero in later stages.

The error introduced by an incorrect comparison is a known quantity and may be corrected for in later stages provided that sufficient charge is available in the scaling channel to restore zero differential. This may be accomplished by increasing the scaling signal in one or more conversion units by a known quantity. The scaling channel input to a series of units determines their full-scale conversion range. Increasing this quantity increases the subrange size and causes adjacent subranges to overlap. The digital bits produced by the later stages must be appropriately scaled to account for the change in converter gain and added to the bits from earlier stages to produce the converter's result.

Blocks 900, 902 represent typical conversion units with negative, positive and scaling channels 910,911, and 912.

The initial series of conversion units 900 is followed by an interface stage 901 which serves to alter the scaling signal charge before passing it forward. This is followed by a final series of conversion units 902. Delay units 920, 921 serve to appropriately delay the results from each stage so that the output bits corresponding to a given input appear simultaneously.

An exemplary interface stage is shown in FIG. 5B. The quantity of charge $g_m$ is doubled before being passed forward. This is achieved by adding a quantity of charge 940 from an independent source, equal to $g_m$ to the scaling channel.

The final digital result for a converter utilizing the interface stage shown in FIG. 5B is produced by multiplier adder 930 using an error correction algorithm shown in FIG. 5C. Doubling the scaling input to the later units will decrease the gain of those units by a factor of two. To compensate for this, the output bits 923 from those stages following the interface are multiplied by a factor of two before being added to the output bits 922 from the initial N1 stages. This multiplication is indicated in the figure by a simple shifting of those bits by one position. The resulting digital word 924 contains N2−1 bits.

Figure 5D:
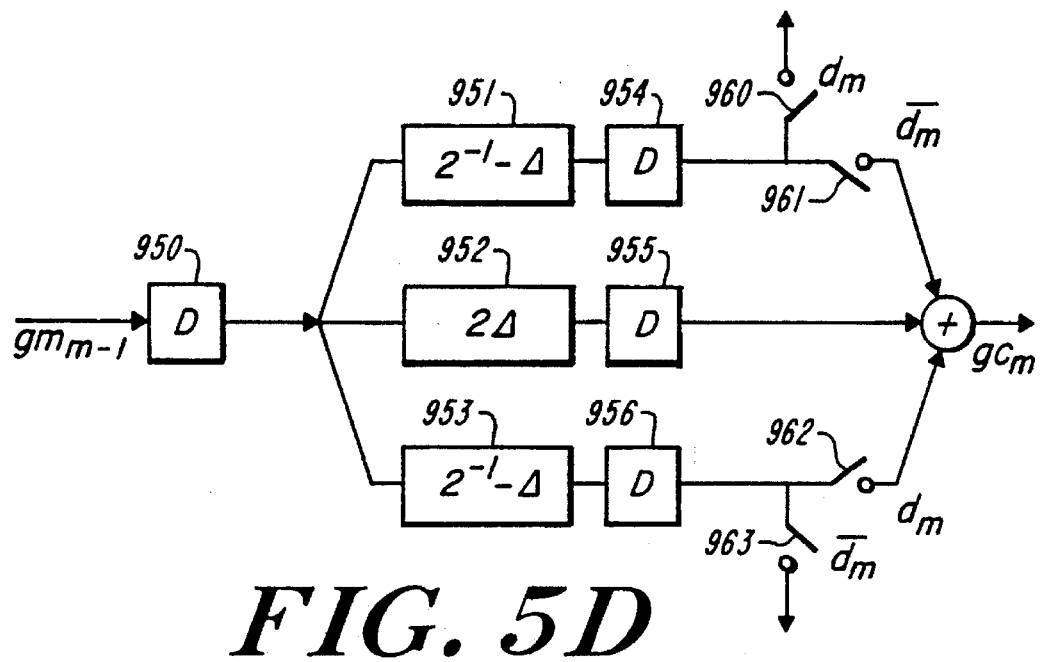
FIG. 5D shows a modified scaling channel.

Instead of adding charge from an independent source, the output $g'_m$ might be generated directly from the converter's full scale input. In this case, a separate interface stage would not be needed and instead the scaling channel in the previously described conversion units would be modified as shown in FIG. 5D. The purpose of this structure is to generate a modification charge which is less than half the scaling input $g_{m-1}$ and to generate a scaling channel output which is equal to more than half the scaling input. This is accomplished by dividing the scaling channel into two equal quantities and a third smaller quantity. One of the two equal charges from delay elements 954 and 956 will be utilized as the modification charge. The other will be passed forward and added to the charge from delay element 955 to become the scaling channel output.

The digital comparator outputs for a converter utilizing the structure shown in FIG. 5D cannot be used directly to construct the digital result. The bits from each pipeline stage must be scaled by the size of the modification charge in that stage and these weighting factors will decrease by a ratio of less than 2 in each successive stage. The converter's result is computed by adding the weighted digital bits for all stages.

Figure 6A:
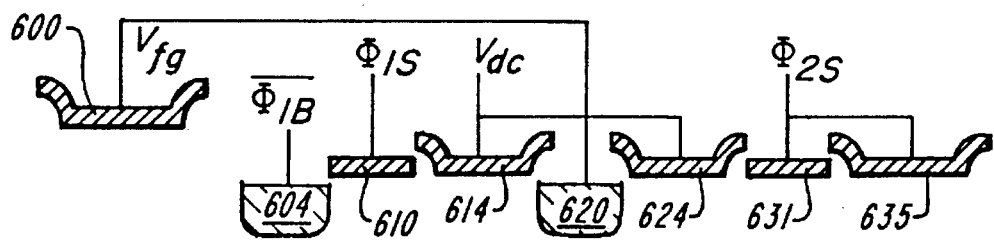
FIG. 6A which shows an exemplary charge replicator.
Figure 6B:
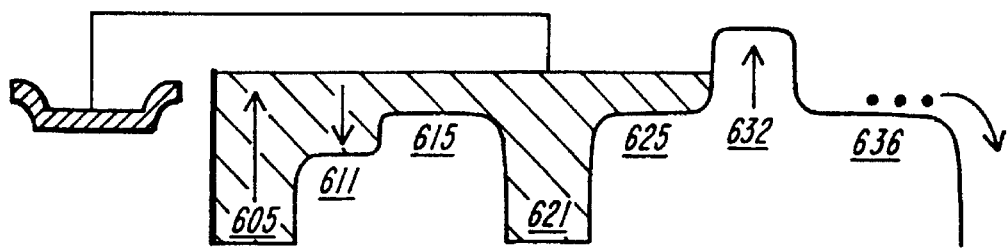
FIGS. 6B–6D show associated energy state diagrams.
Figure 6C:
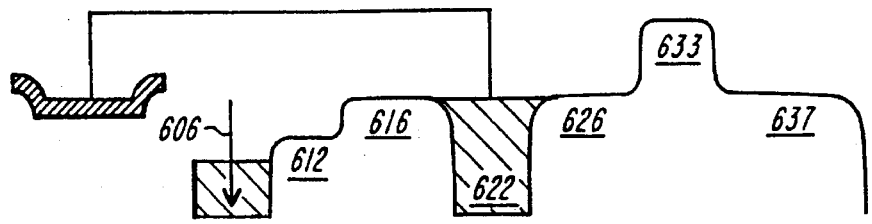
Figure 6D:
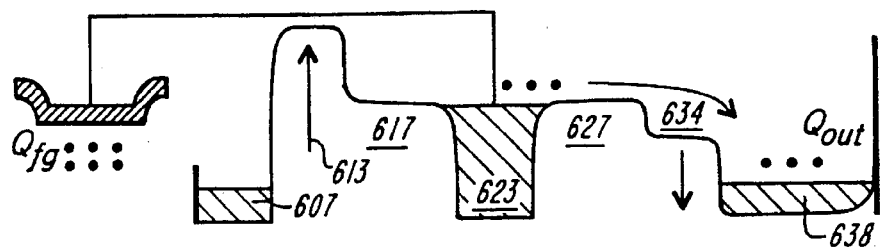

The process of charge replication is described in more detail with reference to FIG. 6A which shows an exemplary charge replicator, and FIGS. 6B–6D showing associated energy state diagrams. Translating small charge signals to voltages introduces significant errors due to the process of resetting and to other sources of noise. The resulting voltage swings are small and the inaccuracy in interpreting the resulting voltage will be dominated by threshold or other mismatches in the receiving gate. For these reasons, an entirely charge-domain method of replication, as illustrated here, is preferable.

A floating gate 600 is initially preset, by a fill-and-spill process, to a level determined by the height of the barrier 615 created by the dc gate 614. The precharge phase, shown in FIG. 6B, begins when the potential on gate 631 falls, the potential on gate 610 rises, and the potential on diffusion 604 falls, thereby closing the sensing path and opening the precharge path. During this 'fill' process, charge from diffusion 605 floods the region underneath gates 611, 615, and 625 and the diffusion 621 which is connected to floating gate 600 is precharged to a low potential. The 'spill' process, shown in FIG. 4C, occurs when the potential on diffusion 606 rises. This causes all channel charge underneath gates 612, 616, and 626 to return to diffusion 606, and the resulting potential on diffusion 622 and floating gate 600 is left equal to the channel potential 616.

The sensing process, shown in FIG. 6D, begins when the potential on gate 613 falls and that on gate 634 rises, thereby closing the precharge path and opening the sensing path. Any charge which is shifted underneath floating gate 600 after this time will cause an approximately equal displacement charge to appear on the node consisting of gate 600 and diffusion 623. The potential on this node will temporarily fall and charge will flow over barrier 627 and be accumulated in receiving well 638. This method of charge replication is an autozeroed process because the precharge is performed with respect to the same barriers, 624 and 625, over which the signal will be sensed during the sensing phase. As a result, operation does not depend critically on any threshold voltages and even matching between different replicators is not required.

Although the potential on the floating gate 600 will vary during the sensing process, it will eventually be restored to its original value. The quantity of charge in the receiving well will depend only on the displacement charge introduced on the gate during the sensing phase. It will be independent of either the CCD capacitance of or the additional parasitics on the floating gate node.

The process of charge replication with feedback is described in more detail with reference to FIGS. 7A-7D which shows an exemplary structure and associated energy state diagrams. The structure is similar to that previously described for the charge replicator of FIG. 6A. However, the node containing gates 614 and 624, which was assumed to be at a fixed potential, is replaced by the node containing gates 714, 724, and 735, whose potential will vary.

A floating gate 700 is initially preset, by a fill-and-spill process, to a level determined by the height of the barrier 715 created by the gate 714. This process is similar to that described above in reference to FIG. 6. During the precharge phase, node $V_{fb}$ is also precharged by means, not shown in the figure, such as a reset transistor or by a separate but similar fill-and spill technique.

Figure 7A:
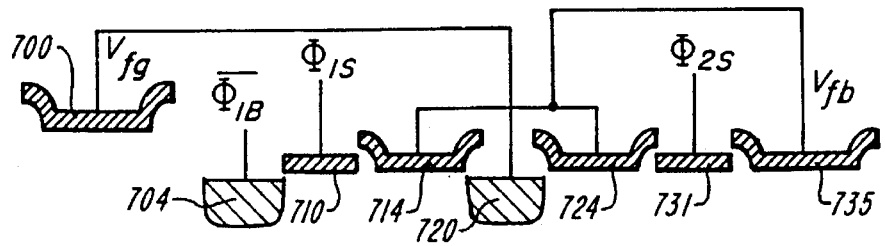
FIGS. 7A–7D respectively show an exemplary structure and associated energy state diagrams illustrating the process of charge replication with feedback.
Figure 7B:
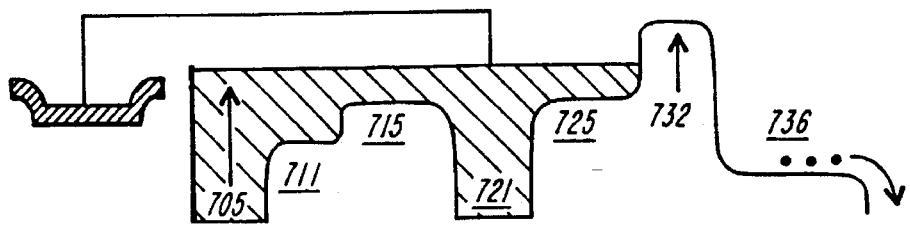
Figure 7C:
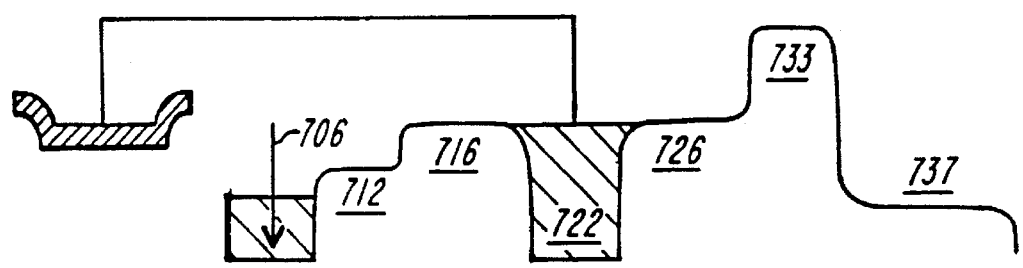
Figure 7D:
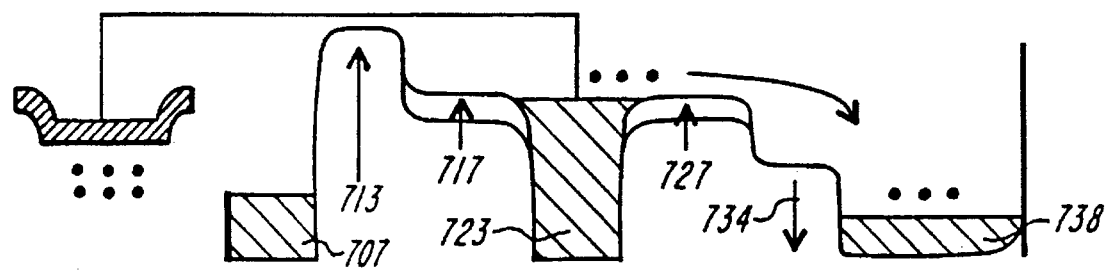

The sensing process, shown in FIG. 7D, begins when the potential on gate 713 falls and that on gate 734 rises, thereby closing the precharge path and opening the sensing path. The precharge on node $V_{fb}$ is released and the node is left floating. Any charge which is shifted underneath floating gate 700 after this time will cause an approximately equal displacement charge to appear on the node consisting of gate 700 and diffusion 723. The potential on this node will temporarily fall and charge will flow over barrier 727 and be accumulated in receiving well 738. This accumulated charge will cause the potential on node $V_{fb}$ to fall and the height of the barriers 717 and 727 to rise. Some of the displacement charge will remain on diffusion 723 and the potential on this node will fall by an amount equal to the change in barrier heights 717 and 727. The output charge will be equal to the input displacement charge minus the portion of this charge which was required to change the potential on $V_{fg}$.

The described configuration requires that the channel potential in the receiving well be more positive than that of the replication barrier, even though the two gates are at the same potential. This can be achieved by any one of a number of techniques such as an offset implant or by making the well a buried channel and the barrier a surface channel. The primary advantage of the structure of FIG. 7A occurs when two such replicators are utilized as a differential pair. If the node $V_{fb}$ is driven to contain a measure of the common-mode signal component between the two, then common-mode rejection can be achieved. If the nodes $V_{fb}$ are driven to contain a measure of the opposite polarity signal, then differential amplification can be achieved.

An exemplary structure for achieving common-mode feedback is shown in FIG. 8A. In this configuration, the floating node $V_{fb}$ is common to both replicators. Common-mode rejection is achieved because the sum of the output charges underneath gates 806 and 807 will cause the node $V_{fb}$ to fall and cause a corresponding increase in the heights of barriers under gates 804 and 809. The resulting output charges will have a common component, proportional to the average of the two signals, subtracted from them.

An exemplary structure for achieving differential mode amplification is shown in FIG. 8B. In this configuration, the output well of the negative side is sensed and used to gate the flow of charge into the positive well and vice versa. The more charge which appears on one side's output, the more charge which will the blocked from entering the opposite side's output.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A charge-to-digital converter including a pipeline of at least one conversion unit, each conversion unit operable for processing a serial stream of positive and negative signal charges corresponding to a differential signal to be digitized, and scaling charges corresponding to a full-scale signal, and for generating a digital output signal, each of said conversion units comprising:

means for receiving positive and negative signal charges and one or more scaling charges from a predetermined source;

positive and negative signal channels operable for processing positive and negative signal charges, respectively;

a distributed sensing pipeline of one or more sensing stages, said sensing stages operable for producing positive and negative accumulator charges representative of the positive charges in said positive signal channel and the negative charges in said negative signal channel;

means for generating positive and negative modification charges corresponding to predetermined proportions of said full-scale signal and associated with said positive and negative signal charges, respectively;

means for generating a digital signal representative of the difference between said positive and negative accumulator charges; and means responsive to said digital signal for enabling the addition of said associated modification charge to the lesser of said positive and negative signal charges and for preventing the addition of said associated modification charge to the greater of said positive and negative signal charges.

2. The charge-to-digital converter of claim 1, wherein said means for generating said digital signal comprise a comparator, and wherein said digital signal corresponds to a single binary bit.

3. The charge-to-digital converter of claim 1, wherein at least one of said sensing stages comprises means for replicating said positive and negative signal charges and for adding the replicated charges respectively to said positive and negative accumulator charges.

4. The charge-to-digital converter of claim 1, wherein the number of sensing stages may vary between conversion units.

5. The charge-to-digital converter of claim 1, wherein at least one of said sensing stages includes feedback for producing positive and negative accumulator charges corresponding to a differentially amplified signal representative of the positive and negative signal charges.

6. The charge-to-digital converter of claim 1, wherein at least one of said sensing stages includes feedback for producing positive and negative accumulator charges corresponding to a reduced common-mode representation of the positive and negative signal charges.

7. The charge-to-digital converter of claim 1, wherein at least one of said conversion units further comprises means for receiving positive and negative signal charges from a preceding conversion unit, and means for providing processed positive and negative signal charges to a subsequent conversion unit.

8. The charge-to-digital converter of claim 1, wherein at least one of said conversion units further comprises means for receiving said scaling charges from a preceding conversion unit, and for providing processed scaling charges to a subsequent conversion unit.

9. The charge-to-digital converter of claim 8, wherein said modification charge generating means comprises a charge splitter which receives said scaling signal and divides it into two equal charges, one of which is be added to its associated signal channel and the other which is provided as a scaling charge input to a subsequent conversion unit.

10. The charge-to-digital converter of claim 1, wherein said modification charge generating means comprises a charge splitter which receives said scaling signal and divides it into first, second, and third charges, one of which is utilized as said modification charge, and the other two of which are summed and provided as the scaling charge input to a subsequent conversion unit.

11. The charge-to-digital converter of claim 1 further comprising positive and negative scaling channels respectively associated with said positive and negative signal charges, operable for producing positive and negative scaling charges and positive and negative modification charges.

12. The charge-to-digital converter of claim 1 further comprising means for processing said digital signals generated by each conversion unit and for producing a digital result representative of the difference between the positive and negative signal charges provided to the first of said conversion units.

13. The charge-to-digital converter of claim 12, wherein said digital result producing means comprises digital deskewing delays for aligning in time said digital signals.

14. The charge-to-digital converter of claim 12, wherein said digital word producing means comprises a digital multiplier and adder for performing error correction or calibration.

15. The charge-to-digital converter of claim 1, wherein at least one of said conversion units further comprises a predetermined number of additional pipeline stages for delaying positive and negative signal charges and scaling charges.

16. The charge-to-digital converter of claim 12, further comprising a cascaded second charge-to-digital converter, said second converter coupled to receive said positive and negative signal charges from the last conversion unit of said first converter and to receive said scaling charge from a predetermined source.

17. A charge-to-digital converter including a pipeline of at least one conversion unit, each conversion unit operable for processing a serial stream of positive and negative signal charges corresponding to a differential signal to be digitized and two or more scaling charges corresponding to normalization signals, and for generating a digital output signal, each of said conversion units comprising:

means for receiving positive and negative signal charges and two or more scaling charges from a predetermined source;

positive and negative signal channels operable for processing positive and negative signal charges, respectively;

means for generating positive and negative modification charges corresponding to predetermined portions of said scaling signal and associated with said positive and negative signals, respectively;

means for generating a digital signal representative of the difference between said positive and negative signal charges; and means responsive to said digital signal for enabling the addition of said associated modification charge to the lesser of said positive and negative signal charges, and for preventing the addition of said associated modification charge to the greater of said positive and negative signal charges.

18. The charge-to-digital converter of claim 17, wherein said means for generating said digital signal comprises a comparator, and wherein said digital signal corresponds to a single binary bit.

19. The charge-to-digital converter of claim 17, wherein at least one of said conversion units further comprises means for receiving positive and negative signal charges from a preceding conversion unit, and means for providing processed positive and negative signal charges to a subsequent conversion unit.

20. The charge-to-digital converter of claim 17, wherein at least one of said conversion units further comprises means for receiving said scaling charges from a preceding conversion unit, and for providing processed scaling charges to a subsequent conversion unit.

21. The charge-to-digital converter of claim 20, wherein each modification charge generating means comprises a charge splitter which receives said scaling signal and divides it into two equal charge packets, one of which is be added to its associated signal channel and the other which is provided as a scaling signal input to a subsequent conversion unit.

22. The charge-to-digital converter of claim 20, wherein each modification packet generation means comprises a charge splitter which receives said scaling signal and divides it into first, second and third charge packets, one of which is utilized as said modification charge packet, and the other two which are summed and provided as the scaling signal input to a subsequent conversion unit.

23. The charge-to-digital converter of claim 17 further comprising means for processing said digital signals produced by each conversion unit and producing a digital result representative of the difference between the positive and negative signal charges provided to the first of said conversion units.

24. The charge-to-digital converter of claim 23, wherein said digital result producing means comprises digital deskewing delays for aligning in time said digital signals.

25. The charge-to-digital converter of claim 23, wherein said digital result producing means comprises a digital multiplier and adder for performing error correction or calibration.

26. The charge-to-digital converter of claim 17, wherein at least one of said conversion units further comprises a predetermined number of additional pipeline stages for delaying positive and negative signal charges and scaling charges.

27. The charge-to-digital converter of claim 17 further comprising a cascaded second charge-to-digital converter, said second converter coupled to receive said positive and negative signal charges from the last conversion unit of said first converter and to receive said scaling charge from a predetermined source.

* * * * *